(12) United States Patent
Posthuma et al.

(10) Patent No.: US 8,664,525 B2
(45) Date of Patent: *Mar. 4, 2014

(54) GERMANIUM SOLAR CELL AND METHOD FOR THE PRODUCTION THEREOF

(75) Inventors: Niels Posthuma, Leuven (BE); Giovanni Flamand, Oelegem (BE); Jef Poortmans, Kessel-lo (BE); Johan van der Heide, Aarschot (BE)

(73) Assignees: IMEC (BE); Umicore, N.V. (BE)

( * ) Notice: Subject to any disclaimer, the term of this patent is extended or adjusted under 35 U.S.C. 154(b) by 759 days.

This patent is subject to a terminal disclaimer.

(21) Appl. No.: 11/340,171

(22) Filed: Jan. 26, 2006

(65) Prior Publication Data

US 2006/0207651 A1 Sep. 21, 2006

Related U.S. Application Data

(63) Continuation-in-part of application No. 11/246,509, filed on Oct. 7, 2005, which is a continuation-in-part of application No. 10/841,803, filed on May 6, 2004.

(60) Provisional application No. 60/468,752, filed on May 7, 2003.

(51) Int. Cl.
*H01L 31/00* (2006.01)

(52) U.S. Cl.
USPC ............... 136/261; 136/256; 438/57; 438/98

(58) Field of Classification Search
USPC .................. 136/243–293; 438/96–98, 57; 257/E23.132, 448, 431
See application file for complete search history.

(56) References Cited

U.S. PATENT DOCUMENTS

| | | | | | |
|---|---|---|---|---|---|
| 4,319,395 A | * | 3/1982 | Lund et al. | .................... | 438/232 |
| 4,468,853 A | * | 9/1984 | Morita et al. | ................... | 438/72 |
| 4,473,597 A | * | 9/1984 | Pankove et al. | ............... | 438/778 |
| 4,724,011 A | * | 2/1988 | Turner et al. | ................... | 136/249 |
| 4,776,894 A | * | 10/1988 | Watanabe et al. | ............. | 136/249 |
| 5,083,007 A | * | 1/1992 | Spletter et al. | ........... | 219/121.64 |
| 5,437,736 A | * | 8/1995 | Cole | ............................. | 136/259 |

(Continued)

FOREIGN PATENT DOCUMENTS

| | | | |
|---|---|---|---|
| GB | 1355890 | 6/1974 | |
| JP | 56-155526 | * 12/1981 | .............. H01L 31/04 |
| JP | 61-294460 | * 12/1986 | |
| JP | 05-048127 | * 2/1993 | .............. H01L 31/04 |

OTHER PUBLICATIONS

Luke et al., "Germanium Orthogonal Strip Detectors with Amorphous-Semiconductor Contacts", 2000 IEEE, pp. 201-204.*
Machine translation of JP-05048127, Feb. 1993.*

(Continued)

*Primary Examiner* — Thanh-Truc Trinh
(74) *Attorney, Agent, or Firm* — Knobbe Martens Olson & Bear LLP

(57) ABSTRACT

A method is disclosed for passivating and contacting a surface of a germanium substrate. A passivation layer of amorphous silicon material is formed on the germanium surface. A contact layer of metal, e.g., aluminum, is then formed on the passivation layer. The structure is heated so that the germanium surface makes contact with the contact layer. The aluminum contact layer can be configured for use as a mirroring surface for the back surface of the device. Thus, a passivated germanium surface is disclosed, as well as a solar cell comprising such a structure.

34 Claims, 10 Drawing Sheets

(56) References Cited

U.S. PATENT DOCUMENTS

| | | | |
|---|---|---|---|
| 6,147,297 A * | 11/2000 | Wettling et al. | 136/256 |
| 6,165,876 A * | 12/2000 | Yamazaki et al. | 438/517 |
| 6,210,991 B1 * | 4/2001 | Wenham et al. | 438/97 |
| 6,326,540 B1 | 12/2001 | Kilmer et al. | |
| 6,339,013 B1 * | 1/2002 | Naseem et al. | 438/491 |
| 6,982,218 B2 * | 1/2006 | Preu et al. | 438/600 |
| 7,960,645 B2 | 6/2011 | Posthuma et al. | |
| 7,964,789 B2 | 6/2011 | Posthuma et al. | |
| 2002/0007793 A1 * | 1/2002 | Sakai et al. | 118/723 E |
| 2003/0003693 A1 | 1/2003 | Meier et al. | |
| 2003/0211704 A1 * | 11/2003 | Shaheen et al. | 438/455 |

OTHER PUBLICATIONS

English Abstract of JP 61-294460, Dec. 1986, 1 page.*

Machida et al., "Development of low cost production technologies for polycrystalline silicon solar cells," Solar Energy Materials and Solar Cells, vol. 48, 1997, pp. 243-253.*

D. K. Schroder, D. L. Meier, "Solar Cell Contact Resistance—A Review," IEEE Transactions on Electron Devices, vol. ED-31(5), 637-647 (1984).

Yong Liu, "High Growth Rate Deposition of Hydrogenated Amorphous Silicon-Germanium Films and Devices Using ECR-PECVD," Ph.D. thesis, Electrical Engineering (Microelectronics), Major Professor Vikram Dalai, OSTI ID 803355, Iowa State University, Ames, IA (2002).

Nguyen Van Dong, Y. Fornier and J. Y. Lee, "Electrical and optical properties of sputtered amorphous siicon films prepared under a reduced pumping speed," Applied Physics Letters 42(7) 594-596 (1983).

Office Action dated Jun. 4, 2007 in co-pending U.S. Appl. No. 10/841,803, filed May 6, 2004.

U.S. Department of Energy—Energy Efficiency and Renewable Energy, Solar Energy Technologies Program, "Silicon", content updated Dec. 23, 2005.

Altermatt et al. "Rear surface passivation of high-efficiency silicon solar cells by a floating junction" J. Appl. Phys. 80 (6), 1996, 3574-3586.

"Microchip Lasers" from the Encyclopedia of Laser Physics and Technology, © Dr. Rudiger Paschotta, RP Photonics Consulting GmbH, http://www.rp-photonics.com/microchip_lasers.html, May 5, 2011.

* cited by examiner

GERMANIUM SOLAR CELL AND METHOD FOR THE PRODUCTION THEREOF

RELATED APPLICATIONS

This application is a continuation-in-part of U.S. application Ser. No. 11/246,509 filed Oct. 7, 2005, which is a continuation-in-part of U.S. application Ser. No. 10/841,803 filed May 6, 2004, which claims the benefit of priority under 35 U.S.C. §119(e) to U.S. Provisional Application No. 60/468,752 filed on May 7, 2003. All above-referenced prior applications are incorporated by reference herein in their entirety hereby made a portion of this specification.

FIELD OF THE INVENTION

The present invention is related to the field of germanium solar cells, germanium photovoltaic cells, including thermophotovoltaic (TPV) cells and germanium photodetectors.

BACKGROUND OF THE INVENTION

To achieve solar cells that convert energy with efficiencies up to 40 percent, quadruple junctions are being investigated. Fabricating such cells is relevant for instance for space applications, because the total array weight and thus the launching cost can be reduced by increasing the energy conversion efficiency. For terrestrial applications the use of such cells results in a decrease of the total amount of cost per Watt, if the sunlight is concentrated.

Currently, double and triple junction cells are being fabricated by several companies using monolithically stacked cells, where germanium is used as a substrate material as well as an active layer. Fabricating monolithically stacked four junction cells and optimizing the current matching for obtaining a high-energy conversion at the end of life (EOL) is quite complex, considering that the various junctions degrade at a different rate.

To lessen the need for current matching, it is interesting to look at the possibility of mechanical stacking of cells. A four terminal stack consisting of a top cell of two junctions in combination with a separate bottom cell is a good compromise between interconnection complexity and growth complexity. Germanium is a suitable material for realizing this bottom cell, because of its low energy band gap, low weight, and relatively low substrate cost.

A stand-alone germanium cell can be used as a bottom cell as a part of a high efficient multi-junction solar cell.

Furthermore a germanium cell is itself an interesting option for use as a receiver in a thermo photovoltaic (TPV) system, where it is used to convert specific radiation from a heat source. The use of germanium in a TPV system is especially interesting because of its relatively low substrate cost compared to other low band gap semiconductors like GaSb. In order to make the application of the germanium solar cell in a TPV system feasible, it will also be essential to keep the processing costs to a minimum.

The main problem of the current germanium cells is the need for good passivation of the front and backside. A good front side passivation is especially critical in germanium cells, because Ge has a quite high absorption coefficient, which causes the light to be absorbed close to the surface and thus makes the device extremely sensitive to recombination at the surface.

Surface passivation can be achieved by applying a certain material on the surface, which fills the dangling bonds and thereby reduces the amount of recombination centers at this surface. For example, materials like silicon oxide, silicon nitride or amorphous semiconductors can be used. These layers can be applied by techniques like chemical vapor deposition (CVD) or sputtering. Depending on the chosen method significant differences in material properties and passivation behavior can be obtained. Especially important with respect to passivation are the amount of hydrogen in the layer and the damage to the surface that is caused by the deposition technique.

European Patent Application No. EP-A-374244 is related to a method of fabricating a solar cell from a silicon substrate on which a passivation layer consisting of silicon nitride is applied, after which contacts are created by applying a silver containing paste onto the passivation layer and 'firing through' the contacts, i.e., subjecting the substrate to a diffusion step, so that silver particles penetrate the silicon nitride layer and make contact with the substrate. The process conditions and the materials chosen for this process are, however, unsuitable for a germanium substrate.

In P. N. Luke et al., 'Germanium Orthogonal Strip detectors with Amorphous-Semiconductor contacts', 1999 IEEE Nuclear Science Symposium Conference Record, Seattle Wash., 25-28 Oct. 1999, a contact layer of amorphous germanium with thickness of 110 nm is sputtered onto the surface of a germanium detector. The amorphous semiconductor layer functions as a blocking junction and acts as a passivation coating for the germanium surface. The provision of contacts as required for solar cells is not discussed.

The formation of contacts after the passivation of a germanium solar cell front side is not obvious. The properties of the germanium substrate and possibly passivation layer should not be altered significantly during this process, which limits process conditions as for instance processing temperatures (preferably kept below 300° C.).

SUMMARY OF THE INVENTION

Various aspects provide a novel method for passivating and contacting a germanium surface. The germanium surface is preferably a surface of a germanium solar cell, a germanium thermo photovoltaic cell, or a germanium photodetector. It can be, for instance, the front or back surface of the solar cell. The front side or front surface is defined as the side adapted for receiving the largest amount of radiation from the sun or other radiation source(s) during use. The backside or back surface is defined as the opposite surface from the front surface. The backside typically receives no or a limited amount of radiation during typical use.

Other aspects provide a novel highly efficient germanium solar cell and a method for producing such a cell.

A first embodiment provides a novel method for passivating and contacting a germanium surface. Preferably the germanium surface is a surface of a germanium solar cell.

The method according to the first embodiment comprises a) providing a germanium substrate with a first surface; this germanium surface can be doped or undoped; b) depositing a layer of amorphous silicon on top of the germanium surface. Advantageously plasma enhanced chemical vapor deposition (PECVD) is used for deposition. Other state of the art techniques are possible. Preferably, the thickness of the layer is generally less than 500 nm. More preferably, the thickness of the layer is less than 300 nm. Even more preferably, the thickness of the layer is less than about 100 nm. Most preferably, for front surface applications, the thickness of the layer is less than about 40 nm. Advantageously for efficient solar cell front surface applications, the thickness of the layer is from about 10 to about 40 nm, e.g., from about 15 nm, 20 nm, or 25 nm to about 30 nm, 35 nm, or 40 nm. For back surface applications the thickness can typically be larger, since the effect of absorption of incident light on the performance is minimal. The thickness is preferably from about 20 nm to about 100 nm. More preferably the thickness is from about 40 nm to about 90 nm. Even more preferably the thickness is from about 50 nm to about 80 nm. If the thickness becomes too large, it may become more difficult to diffuse/fire the contact metal through the layer. Of particular note is the cleaning treatment preceding the deposition, gas flow composition and applied RF-power for forming the plasma. Preferably, the PECVD is performed at a wafer temperature of from about 150° C. to about 250° C. or 300° C., e.g., from about 160° C., 170° C., 180° C., 190° C., 200° C., or 210° C. to about 220° C., 230° C., 240° C., 250° C., 275° C., or 300° C. A higher deposition temperature results in out-diffusion of the hydrogen within the material, which subsequently results in less desirable passivation properties; c) depositing a patterned layer of metal on top of the layer of amorphous silicon. This can be done by any state of the art technique. Preferably the metal is a highly conductive metal such as Pd, Cu, Ag, Au or Al. Pd, Cu, Ag, and Au are advantageously used in front surface applications, while Al can advantageously be used for backside passivation schemes. In backside passivation schemes, the aluminum can generate a back surface field (BSF), which would not be desirable on the front surface; if employed in front surface applications, Al could possibly form a p++ region which repels the holes at the front side, preventing collection of the holes on the front. Also, a multi-layer comprising two or more different metal layers can be applied, such as Pd/Ag, Pd/Au, or Pd/Cu. This step can comprise different sub steps. This layer can be patterned to form a contact grid; and d) "Firing through" or diffusion of the metal through the layer of amorphous silicon by applying a temperature step, such that the germanium surface is contacted. The diffusion step should be chosen such that the process can be controlled. The effect of the diffusion or fire through is that metal particles of the contact layer penetrate through the amorphous silicon passivation layer to form a conductive path between the contact and the Ge-substrate. The resulting contacting resistivity is preferably lower than $5 \cdot 10^{-4}$ $\Omega cm^2$, more preferably lower than $10^{-4}$ $\Omega cm^2$, most preferably lower than $10^{-5}$ $\Omega cm^2$. The quality of the passivation layer is strongly affected by the cleaning treatment preceding the deposition. For instance a wet-chemical HF-dip and a $H_2$ plasma can be used to prepare the surface.

As discussed above, the methods for passivating and contacting according to the preferred embodiments can be applied to the front surface as well as to the back surface of the photovoltaic device, thus also to both surfaces. This results in corresponding devices.

In certain embodiments wherein both front surface and back surface are processed according to methods of the preferred embodiments, a single firing step can be performed for firing front as well as back contacts. The amorphous layer can in certain embodiments be applied to both sides at the same time, in a single step. This can be done by a proper design of the deposition chamber and/or choosing certain orientations of the Ge wafers. In a typical chamber the wafers can be placed at an angle with respect to the horizontal direction (defined as orthogonal to the direction of gravity), as, for example, vertical (i.e., an angle of 90 degrees).

In the preferred embodiments illustrated in FIGS. 6 and 7, the firing step can be performed locally (e.g., defining a pattern), for example, by use of a laser. The use of a laser allows for local heating. The methods of these embodiments are particularly desirable in the case of back surface applications, where patterning of the metal layer is not necessary. When applying a heating step, a eutectic alloy (e.g., GeAl on the back surface) is formed, which forms the contacts. The regions where these eutectic alloys are present have been found to be less reflective. Therefore, methods of certain preferred embodiments, advantageously useable for backside applications, do not produce a patterned metal layer, but instead a continuous layer which serves as a reflector, also called mirror surface. A local heating by, for example, a laser can provide a good contact pattern, and leaves the remaining Ge/Al interface as is, such that its reflecting properties are not jeopardized.

FIG. 9 shows some measurements which illustrate the reflection properties, measured from the font, of a 90 μm germanium substrate covered on the backside with, respectively, gold, silver, amorphous silicon-gold, amorphous silicon-silver and an annealed (440° C., 20 min) aluminum layer. The front side of the substrate was covered with a $ZnS/MgF_2$ anti-reflective (AR) coating. The annealed aluminum layer at the back gives a relatively low reflection of a maximum of 20 percent at 1800 nm. Using a good reflective metal like gold or silver increases the reflectivity up to 50 percent at 1800 nm. The fact that the effect of the backside reflection only takes place for high wavelengths can be explained by only these photons reaching the backside of the cell.

Since there is a substantial influence of a high surface recombination velocity at the backside of the solar cell, excellent back surface passivation is desirable. This can be achieved by applying, e.g., a thin (50 nm) layer of amorphous silicon by PECVD. This passivation layer is located between the germanium substrate and the metal layer at the back, and lowers the reflectance by 10% when compared to the metal layer only, but the reflectance is still twice as good when compared to the annealed aluminum contact.

Different combinations of firing techniques can be employed on the front and back surfaces. For example, on the front side the metal can be patterned and fired by an overall heating step, or by an overall illumination by a laser of the appropriate energy, and on the backside a continuous layer can be applied locally contacting the Ge substrate, by a laser treatment along a predetermined contact pattern. Different metals can be used on the front and back surfaces. In certain embodiments also the back side metal can be patterned and fired by local or general heating, after which an additional mirror layer can be provided in the areas where no back contact is provided. This may require additional patterning or masking. Preferably materials which show good reflection properties can be used for the additional mirror layer, for example, gold (Au), silver (Ag) If the additional mirror layer is to be applied before contact firing, the material is preferably selected such that it does not easily diffuse through the passivation layer and/or into the germanium substrate upon contact firing. It is preferably selected such that the reflectivity of the interface between the additional mirror layer and the passivation layer/germanium substrate is left substantially intact during contact firing.

In FIG. 5 the measured effective minority carrier lifetime is plotted in function of the duration of the exposure time of the substrate to the H2 plasma during the preliminary cleaning step. The amount of exposure plays a significant role in the optimization of the solar cell efficiency.

A further improvement of the quality of the passivation is achieved by optimizing the layer thickness. A layer that is too thin results in lower quality passivation properties, while a layer that is too thick absorbs a larger part of the solar spectrum. For application in a mechanically stacked solar cell, or in a TPV cell the restrictions concerning the thickness are less stringent since in these applications the part of the spectrum that is used by the germanium cell will not be absorbed in the amorphous silicon layer.

In a first aspect of the first embodiment, the method can be used for the production of a germanium solar cell. The method according to the first aspect of the first embodiment comprises the following steps (see FIG. 1).

Step A.

Providing a p-type (or alternatively n-type) germanium substrate (1); and forming the emitter (n⁺ region, 2) in the p-type germanium substrate, by means of diffusion using a source of spin-on dopant (3) (SOD, preferably comprising phosphorous (P)). A possible alternative is the reversed situation with a p⁺ emitter in the n-type substrate. The most relevant parameters are the diffusion time, diffusion temperature, diffusion atmosphere, and the phosphorous content of the SOD. The diffusion temperature is preferably from about 500 to about 700° C. More preferably a temperature of about 600° C. is used. The diffusion time is preferably from about 10 seconds to about 20 minutes. More preferably a diffusion time of about 30 seconds is used. The diffusion atmosphere is preferably a forming gas such as $N_2+H_2$ (10%). Subsequent to the diffusion the spin-on material is removed using an HF solution.

Step B.

Application of the back contact (4) and formation of the back-surface field (BSF), using preferably aluminum applied by evaporation. Subsequently the Al is diffused into the substrate by applying a temperature step in a forming gas (preferably $N_2+H_2$ (10%)) to create a p⁺ zone that serves as a back surface field (BSF) (5). Preferably an about 1 μm thick aluminum layer is evaporated. The diffusion temperature is preferably from about 350 to about 600° C. The diffusion time is preferably from about 10 minutes to about 60 minutes. The diffusion atmosphere is preferably a forming gas such as $N_2+H_2$ (10%).

Step C.

Defining the solar cell area by etching the mesa structures.

Step D.

Passivation of the front side by applying a very thin layer of intrinsic hydrogenated amorphous silicon (Si:H) (6) using plasma enhanced chemical vapor deposition (PECVD). Preferably the surface is prepared by a wet-chemical treatment using HF and subsequently applying a $H_2$ plasma, inside the deposition chamber, performed just before the deposition of the amorphous silicon. Preferably the applied RF power is less than 50 Watt. More preferably the power is less than 15 Watt. The exposure time is preferably less than 2 minutes; more preferably the exposure time can be chosen between 30 and 45 seconds. Preferably the thickness of the layer is less than about 100 nm. More preferably a thickness of smaller than about 50 nm or about 40 nm can be chosen. For solar cell and thermophotovoltaic cell applications, a thickness of about 10 nm to about 40 nm or 50 nm can be advantageous when considering front side passivation schemes. For backside passivation schemes, the thickness is preferably greater, as described above. Thicker layers may absorb too much light, which can be disadvantageous when a high efficiency of a solar cell is important. Gas flow composition and applied RF-power are critical for forming the plasma. Preferably the PECVD is performed at a wafer temperature of from about 150 to about 250° C. Preferably the plasma is from about 6 to about 20 Watts. Preferably the gas composition comprises from about 20 to about 100 sccm $SiH_4$ and from about 0 to about 600 sccm $H_2$.

Steps E and F.

Application of the front contact by evaporation of the metal, preferably silver (Ag) copper (Cu) or gold (Au) contact structure (E), using preferably lift-off to define the finger pattern (F,7). For instance an about 2 μm thick metal layer can be used. Alternatively a multi-layer of different types of metal can be used like Pd/Ag, Pd/Cu, or Pd/Au. The material of the first layer, preferably Pd, is diffused through the passivation layer to obtain a low contact resistance. The second, preferably highly conductive metal layer such as Ag, Cu or Au, serves to obtain a low series resistance. The second layer can be evaporated or applied by electroplating. For instance a multi-layer comprising a 50 nm layer and a 2 μm layer can be applied. Cu as a second layer in the multilayer can be advantageous since it can be applied via electroplating and thus allow formation of thick layers (e.g., thicker then 2 microns), which can be desirable in applications where high currents are generated, as in, for instance, thermo-photovoltaic systems or concentrator systems.

Step G.

Firing through the amorphous silicon layer of the applied metal contacts (diffusion of the metal through the passivating amorphous silicon layer) in order to obtain a good contact with the n⁺ germanium emitter. Critical are the diffusion time and temperature. The diffusion temperature is preferably from about 150 to about 300° C., for instance, about 220° C. More preferably a temperature of from about 160 or 170° C. to about 250° C. is used, and most preferably, a temperature of from about 180° C. to about 230° C. or 240° C. is used. The diffusion time is preferably between 1 min and 60 min. Depending on the thickness of the passivation layer, the optimal diffusion time will change. The diffusion atmosphere is preferably a forming gas (as N2+H2 (10%)).

Step H.

Evaporation of the anti-reflective coating (8) using preferably zinc sulfide (ZnS) and magnesium fluoride ($MgF_2$).

In a second aspect, a method of passivating and contacting a surface of a germanium substrate is provided, comprising providing a germanium substrate having a first surface, wherein the first surface is configured to be used as a back surface of a photovoltaic device; forming a first passivation layer comprising an amorphous silicon material on the first surface; forming a contact layer on the first passivation layer, wherein the contact layer comprises a first metal layer, the first metal layer comprising aluminum; and heating the substrate and the layers so that the first surface makes contact with the contact layer through the first passivation layer.

In an embodiment of the second aspect, the first metal layer consists essentially aluminum.

In an embodiment of the second aspect, heating the substrate and the layers is performed locally, in a predetermined contact area. The heating can be by a laser.

The contact layer can be a continuous layer configured for use as a mirroring surface for the back surface.

In an embodiment of the second aspect, a contact resistivity of a conductive path between the contact layer and the substrate is less than about $10^{-4}$ Ωcm².

In an embodiment of the second aspect, the method further comprises cleaning the first surface before forming the first passivation layer, the cleaning comprising applying a $H_2$ containing plasma to the first surface.

In an embodiment of the second aspect, the method further comprises cleaning the first surface before forming the first passivation layer, the cleaning comprising applying a wet-chemical HF dip to the first surface.

In an embodiment of the second aspect, forming the first passivation layer is performed by plasma enhanced chemical vapor deposition.

In an embodiment of the second aspect, the plasma enhanced chemical vapor deposition is performed at a temperature of from about 150° C. to about 300° C.

In an embodiment of the second aspect, the first passivation layer has a thickness of less than about 100 nm.

In an embodiment of the second aspect, the first passivation layer has a thickness of less than about 80 nm.

In an embodiment of the second aspect, the first passivation layer has a thickness of from about 20 nm to about 100 nm.

In an embodiment of the second aspect, a photovoltaic device is obtained by the method, wherein the photovoltaic device is selected from the group consisting of a solar cell, a thermophotovoltaic cell, and a photodetector.

In an embodiment of the second aspect, the contact layer further comprises an additional metal layer, the additional metal layer comprising at least one metal selected from the group consisting of Cu, Ag, and Au.

In an embodiment of the second aspect, the first metal layer is deposited atop the first passivation layer, and wherein the additional metal layer is deposited atop the first metal layer. The additional metal layer can be deposited by evaporation, or by electroplating.

In an embodiment of the second aspect, the contact layer is patterned to form a contact grid.

In an embodiment of the second aspect, the heating is performed at a temperature lower than about 300° C.

In an embodiment of the second aspect, the heating is performed at a temperature of from about 180° C. to about 240° C.

In an embodiment of the second aspect, the method further comprises forming an emitter area in the germanium substrate; forming a second passivation layer comprising an amorphous silicon material on a second surface of the germanium substrate, wherein the second surface is configured for use as front surface of a photovoltaic device; forming a front contact layer on the second passivation layer, wherein the front contact layer comprises a second metal layer; and heating the substrate and the layers so that the second surface makes contact with the front contact layer through the second passivation layer. The second metal layer can comprise a metal selected from the group consisting of Pd, Cu, Ag, and Au. Only one heating step can be performed for the front surface and the back surface. The second surface can make contact with the front contact layer through the second passivation layer before the first surface makes contact with the contact layer through the first passivation layer.

In a third aspect, a passivated germanium substrate is provided, comprising a germanium substrate comprising a first surface; a passivation layer comprising an amorphous silicon material formed on the first surface; and a metal contacting layer on the passivation layer, the metal contacting layer contacting the substrate through the passivation layer, by particles of the metal that are penetrated into the passivation layer to form a conductive path between the contacting layer and the germanium substrate, wherein the contacting layer comprises a first metal layer, the first metal layer comprising aluminum.

In an embodiment of the third aspect, the amorphous silicon material is deposited by plasma enhanced chemical vapor deposition.

In an embodiment of the third aspect, the passivation layer comprises a conductive material in an area underlying the contacting layer and between the contacting layer and the germanium substrate.

In an embodiment of the third aspect, the passivation layer has a thickness of from about 20 nm to about 100 nm.

In a fourth aspect, a photovoltaic device is provided comprising a germanium substrate having a first surface; a passivation layer comprising an amorphous silicon material formed on the first surface; and a contacting layer comprising a conductive material formed on the passivation layer, wherein the contacting layer comprises a first metal layer, the first metal layer comprising aluminum.

In an embodiment of the fourth aspect, the amorphous silicon material is deposited by plasma enhanced chemical vapor deposition.

In a fifth aspect, a photovoltaic device is provided comprising a germanium substrate having a first surface and a second surface; a first passivation layer comprising amorphous silicon material formed on the first surface; a second passivation layer comprising amorphous silicon material formed on the second surface; a first contacting layer comprising a conductive material formed on the first passivation layer, wherein the first contacting layer comprises aluminum; and a second contacting layer comprising a conductive material formed on the second passivation layer, wherein the second contacting layer comprises a metal selected from the group consisting of Pd, Cu, Ag, and Au.

In an embodiment of the fifth aspect, the amorphous silicon material is deposited by plasma enhanced chemical vapor deposition.

Figure 2:
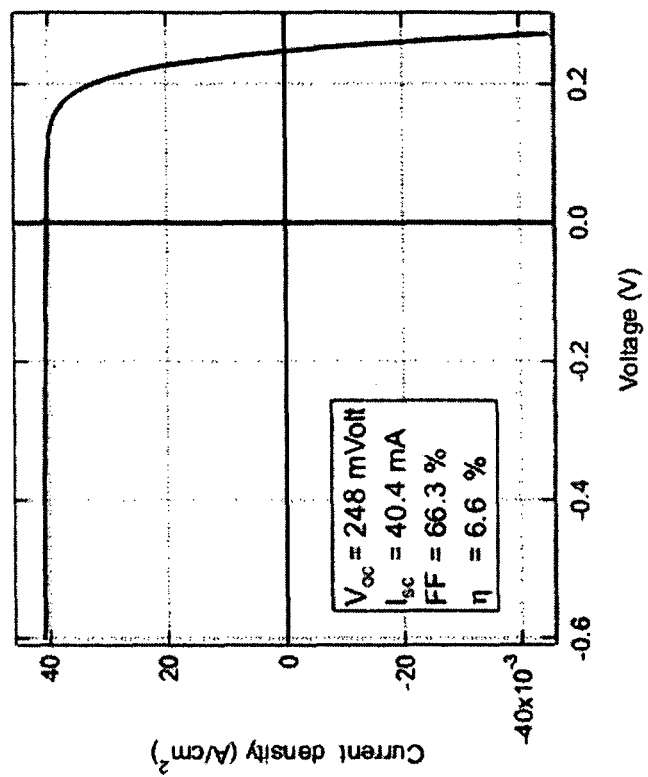
FIGS. 2 and 3 illustrate the performance of a solar cell according to a preferred embodiment.

As shown in the current-voltage characteristic shown in FIG. 2, the short circuit current ($J_{sc}$) is equal to 40.4 mA/cm$^2$, the open circuit voltage Voc is equal to 248 mV and the fill factor (FF) was found to be 66.3%. An AM1.5 efficiency of 6.64% was measured.

Figure 3:
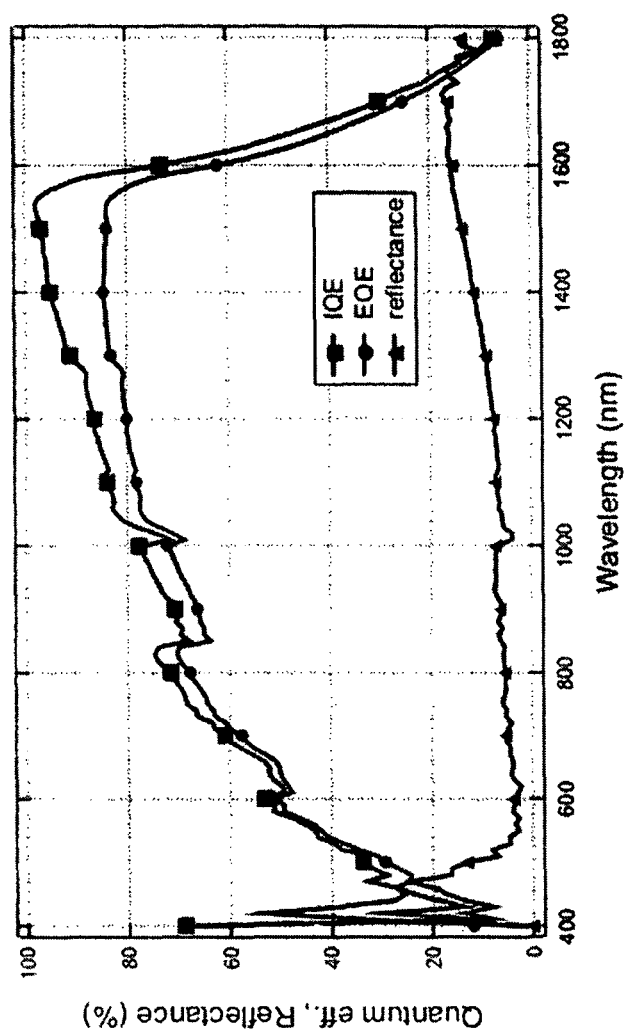

FIG. 3 illustrates the internal quantum efficiency, the external quantum efficiency, and the reflectance of a solar cell created by a preferred embodiment of the present invention, in function of the wavelength of the incoming light. The good quality of the passivation layer is shown by the excellent response at low wavelengths.

Figure 4:
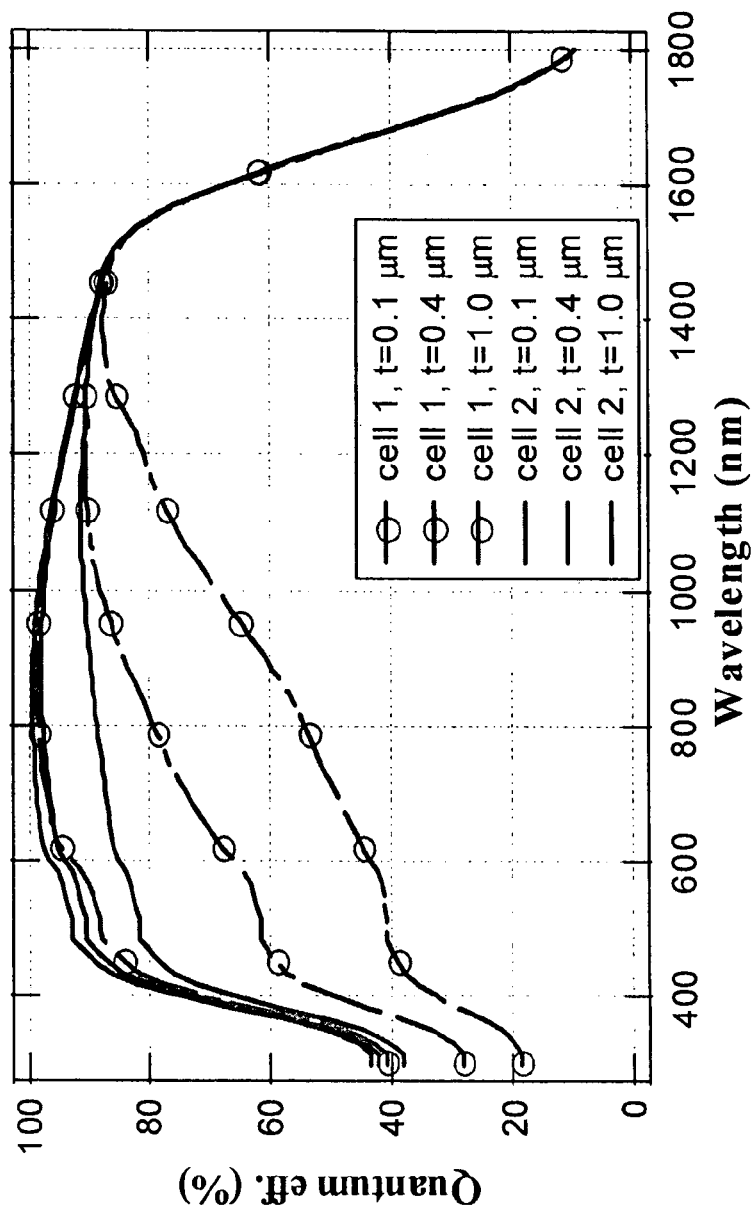

FIG. 4 shows simulation results were the emitter thickness and surface recombination velocities have been varied.

Figure 5:
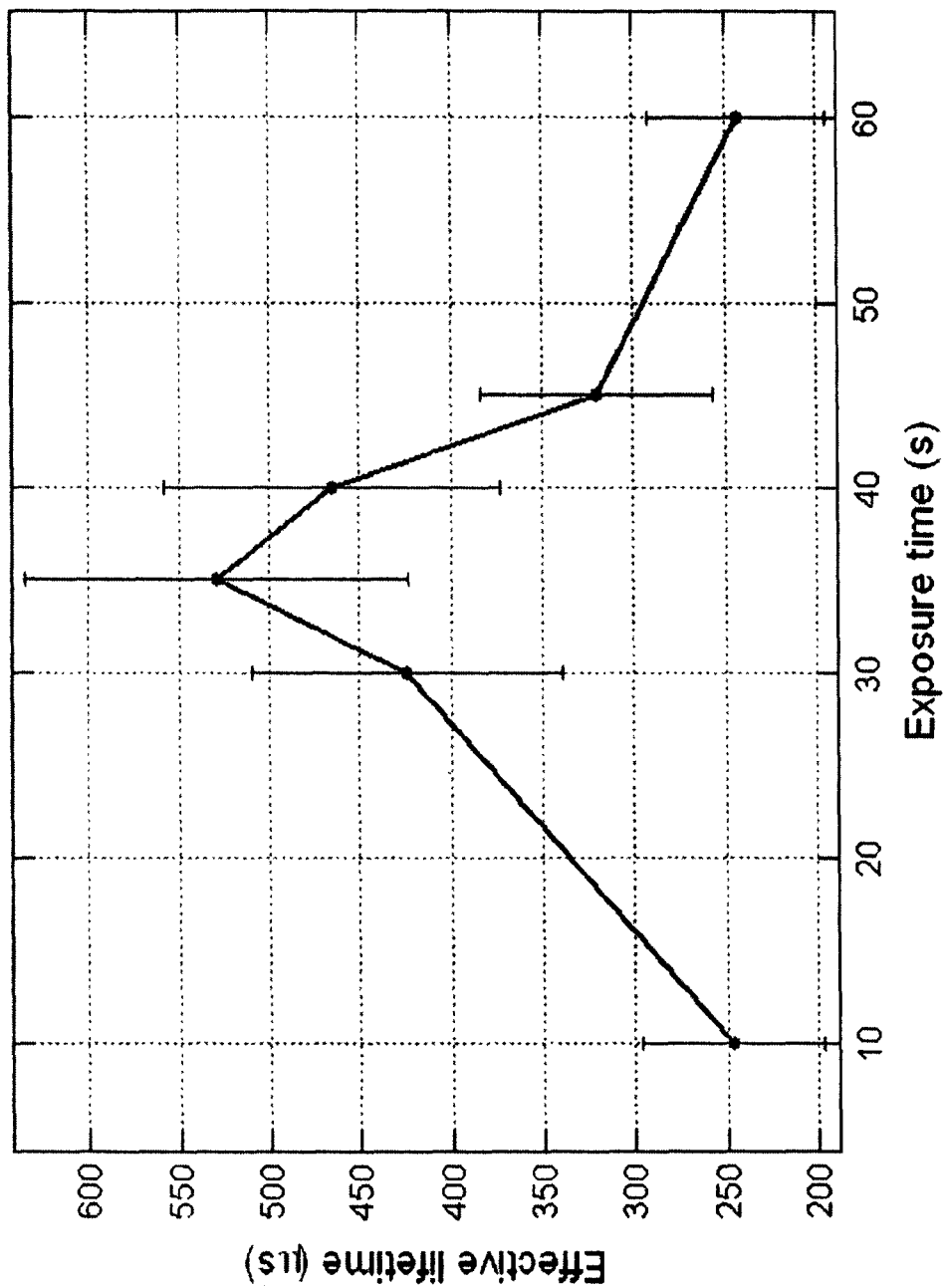

FIG. 5 is the carrier lifetime is plotted in function of the duration of the exposure time of the substrate to the $H_2$ plasma during the preliminary cleaning step.

Figure 6:
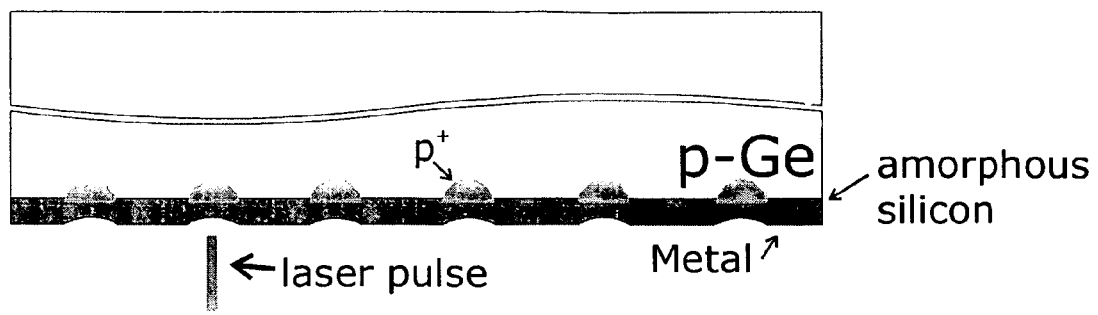

FIG. 6 illustrates the process of achieving laser fired contacts, according to embodiments of the present invention.

Figure 7A:
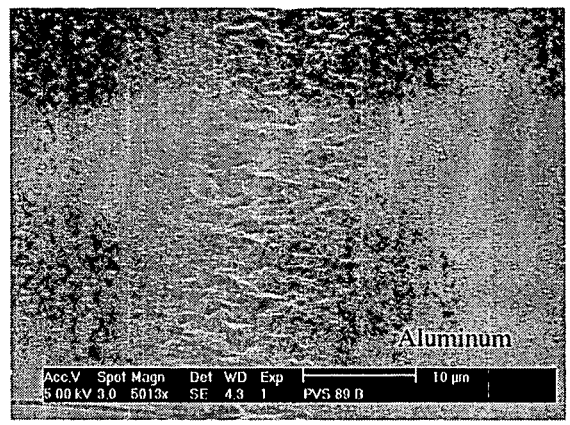
Figure 7B:
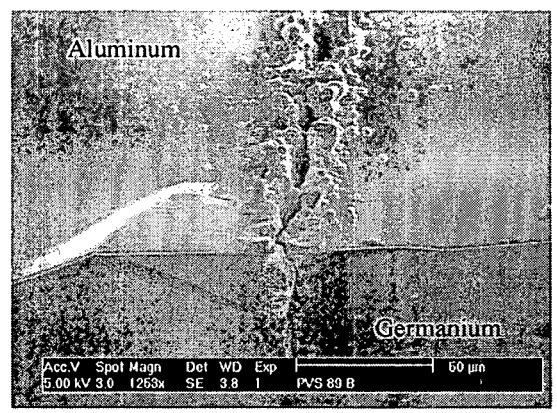
Figure 7C:
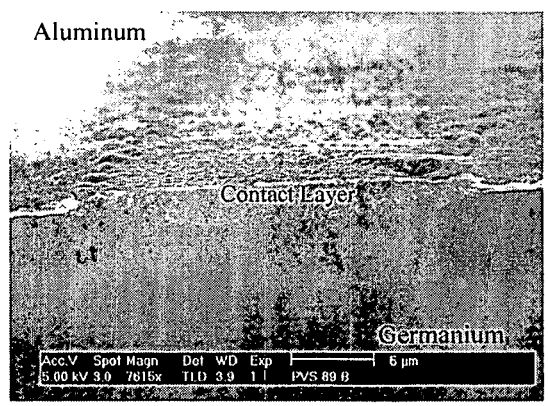

FIG. 7(a) through (c) provides SEM pictures of an Al-a-Si—Ge interface where a laser beam has been applied. In FIG. 7(a) the power was about 0.4 W, whereas it was about 1 W in FIG. 7(b) and 0.6 W in FIG. 7(c).

Figure 8A:
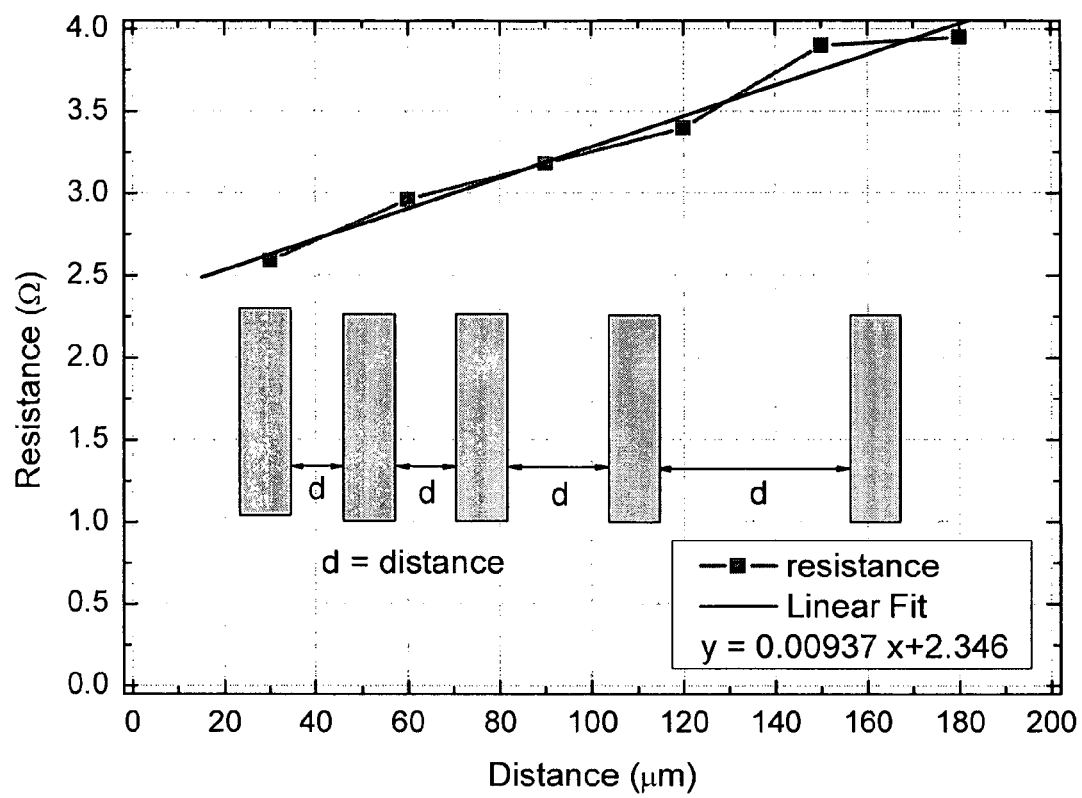
Figure 8B:
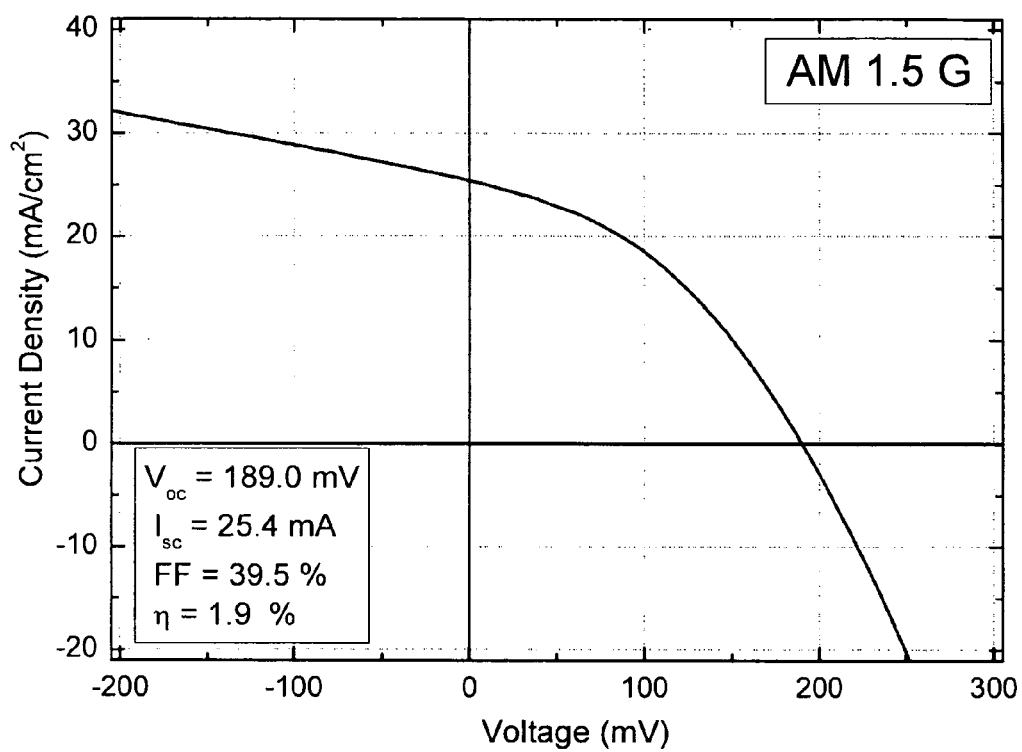

FIGS. 8(a) and 8(b) provide results of a transfer length method (TLM) measurement and IV characteristics of a LFC substrate, respectively.

Figure 9:
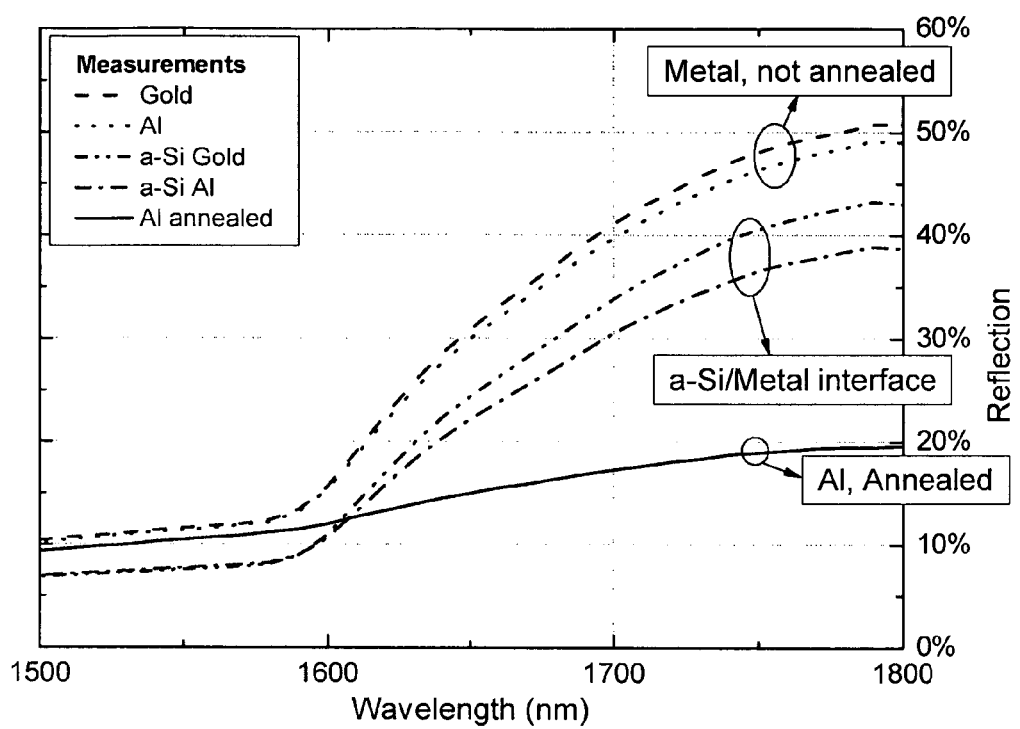

FIG. 9 provides a measurement of the reflection of germanium substrates covered with different metals at the back.

DETAILED DESCRIPTION OF THE PREFERRED EMBODIMENT

Figure 1:
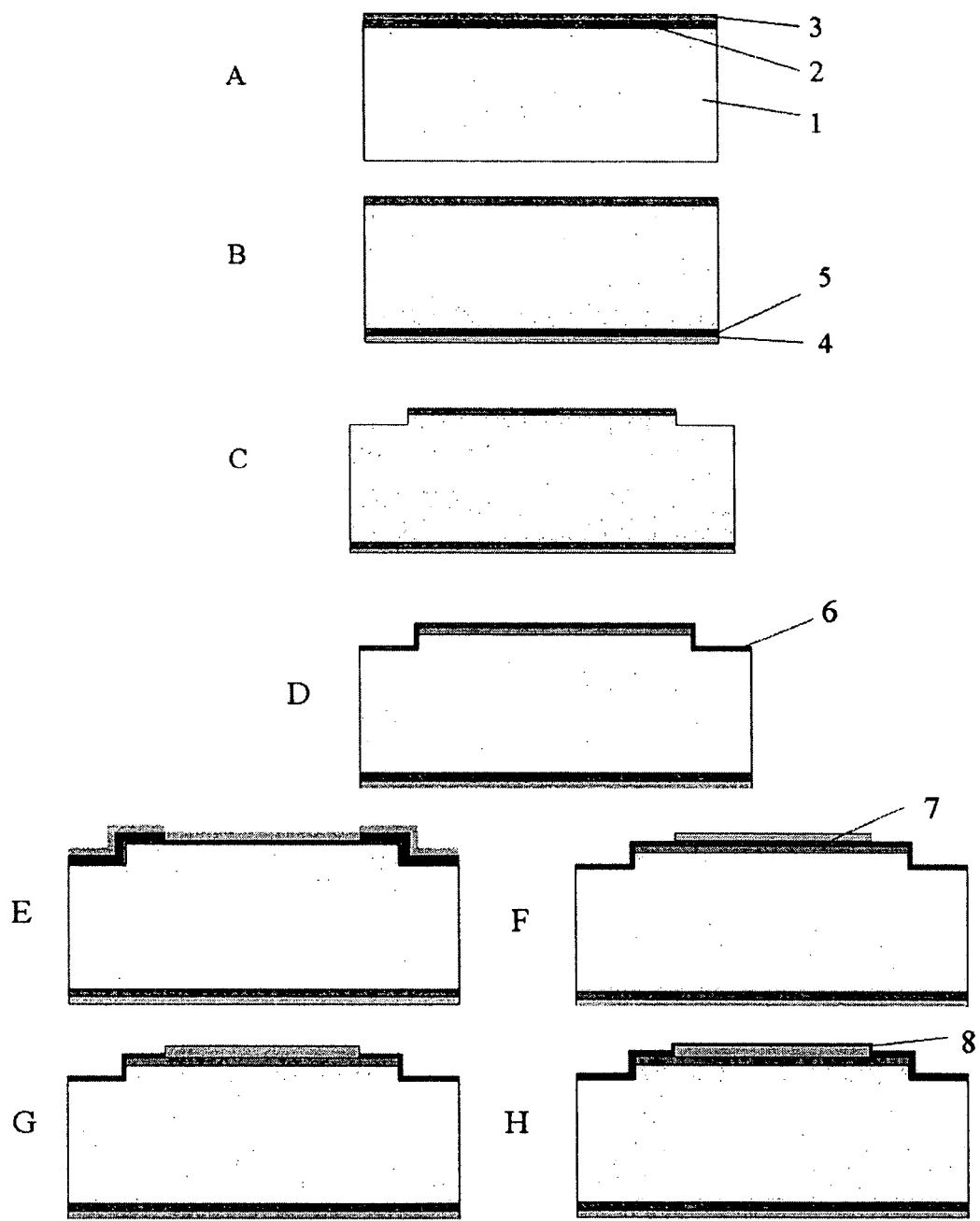
FIG. 1 illustrates an embodiment whereby a germanium solar cell is produced, passivated by the method according to the present invention (FIG. 1).

A preferred embodiment of a method or the production of a germanium solar cell comprises the following steps (FIG. 1):

Step A.

Providing a p-type germanium substrate (1) and forming the emitter (n+ region, 2) in the p-type germanium substrate, by means of diffusion using a source of spin-on dopant (3). A diffusion temperature of 600° C. and a diffusion time of 30 seconds were used. The diffusion atmosphere was a forming gas, $N_2+H_2$ (10%).

Step B.

Application of the back contact (4) and realization of the back-surface field (BSF) (5), using aluminum applied by evaporation. Subsequently the Al is diffused into the substrate by applying a temperature step in forming gas ($N_2+H_2$(10%)) to create a p+ zone that serves as a back surface field (BSF) (5). A 1 μm thick aluminum layer was evaporated. The diffusion temperature was between 350 and 600° C. The diffusion time is between 10 minutes and 60 minutes. The diffusion atmosphere is a forming gas N2+H2 (10%).

Step C.

Defining the solar cell area by etching the mesa structures.

Step D.

Passivation of the front side by applying a very thin layer of intrinsic hydrogenated amorphous silicon (Si:H) (6) using plasma enhanced chemical vapor deposition (PECVD) at a substrate temperature of 170° C. A layer with thickness of 10 nm was deposited. The plasma power was between 6 and 20 Watts. The gas composition was comprised between 20 to 100 sccm $SiH_4$ and between 0 to 600 sccm $H_2$. The surface is prepared by a wet-chemical HF treatment and a $H_2$ plasma.

Steps E and F.

Application of the front contact by evaporation of the palladium (Pd) silver (Ag) multi-layer contact structure (E), using lift-off to define the finger pattern (F,7). The lift off comprised selectively depositing a resist layer on the layer of amorphous silicon before the Pd/Ag deposition. After the following Pd/Ag deposition the resist is removed—together with the Pd/Ag deposited on the resist, such that only the area where no resist had been applied remains covered with Ag. A 50 nm palladium and a 2 μm thick silver layer were used.

Step G.

Firing through the amorphous silicon layer of the applied Pd/Ag contacts (diffusion of palladium through the passivating amorphous silicon layer) in order to obtain a good contact with the n+ germanium emitter. Critical are the diffusion time and temperature. A diffusion temperature of 220° C. and a diffusion time of about 2 to 20 minutes were used. The diffusion atmosphere was a forming gas (N2+H2 (10%)).

Step H.

Evaporation of the anti-reflective coating (8) using zinc sulfide (ZnS) and magnesium fluoride ($MgF_2$).

FIGS. 2 and 3 illustrate the performance of a solar cell according to a preferred embodiment of the present invention. As shown in the current-voltage characteristic shown in FIG. 2, the short circuit current ($J_{sc}$) is equal to 40.4 mA/cm², the open circuit voltage Voc is equal to 248 mV and the fill factor (FF) was found to be 66.3%. An AM1.5 efficiency of 6.64% was measured.

FIG. 3 illustrates the internal quantum efficiency, the external quantum efficiency, and the reflectance of a solar cell created by a preferred embodiment of the present invention, in function of the wavelength of the incoming light.

Important for the fabrication of a germanium cell with efficiencies as shown by cell obtained by application of the techniques of the preferred embodiments, is thickness of the emitter and the applied surface passivation technique. FIG. 4 shows simulation results where the emitter thickness and surface recombination velocities have been varied. Cell 1 has a simulated front surface recombination velocity ($S_{front}$) of 70000 cm/s and cell 2 has $S_{front}$ equal to 50 cm/s. With decreasing emitter depth and decreasing recombination velocity at the front surface the response of the cell improves.

After passivating the backside using PECVD amorphous silicon, a 1 μm thick metal contact layer can be deposited by evaporation. Subsequently, the metal can be heated locally by applying a laser pulse. For this application, a green (532 nm) YAG laser can be employed; however, other lasers can also be employed. The heating generated by the laser pulse results in the diffusion of the metal through the amorphous silicon and inside the germanium layer forming the contact. Aluminum is advantageous for back surface contacting, because aluminum dopes the germanium and thereby forms a local p+ layer at the contact that acts as a back surface field. Aluminum also exhibits good reflective properties.

The power of the laser is chosen such that it can be used in the processes as described above. Therefore several parameters can be adjusted as desired. Some parameters that can be adjusted include the current through the laser diode, the moving speed of the laser beam, and the focusing of the laser beam.

By changing these parameters the power of the laser beam that the substrate is exposed to can be tuned. In FIG. 7, two SEM pictures are displayed where the influence of the laser power is shown. In FIG. 7(a) the power of about 0.4 W was too low to make contact, while FIG. 7(b) shows that a laser beam of about 1 Watt seriously damaged the surface. Further tests have been carried out where the laser power was varied. In FIG. 7(c), a laser beam with a power of about 0.6 Watt was applied and achieved acceptable results. The diode current was 20 A, the propagation speed of the laser beam was 500 mm/min, and the stage was 0.250 mm out of focus. The laser frequency was about 100 kHz. The cross-section in FIG. 7(c) shows a connection between the upper layer (aluminum) and the germanium substrate.

The contact resistance was measured for the contact shown in FIG. 7(c) using the transfer length method. In this measurement, the resistance between two contact points was measured over several increasing distances and the results are shown in FIGS. 8(a) and 8(b). The resistance showed an Ohmic character. Based on the results of the measurement of the contact shown in FIG. 7(c), a specific contact resistance of about $7.6 \cdot 10^{-4}$ Ω-cm calculated, which makes this technique suitable for TPV applications.

Using the structure shown in FIG. 7(c), a first-time germanium TPV cell has been developed using LFC. It is believed that the laser lines as a contact grid at the back can be further optimized, improving the device, for example, by improving the Fill Factor (FF). Solar cell behavior has also been observed. The measured values of $V_{oc}$=189 mV, $J_{sc}$=25.4 mA, FF=39.9% and η=1.9% demonstrate the applicability of LFC in germanium TPV cells.

All references cited herein are incorporated herein by reference in their entirety. To the extent publications and patents or patent applications incorporated by reference contradict the disclosure contained in the specification, the specification is intended to supersede and/or take precedence over any such contradictory material.

The term "comprising" as used herein is synonymous with "including," "containing," or "characterized by," and is inclusive or open-ended and does not exclude additional, unrecited elements or method steps.

All numbers expressing quantities of ingredients, reaction conditions, and so forth used in the specification and claims are to be understood as being modified in all instances by the term "about." Accordingly, unless indicated to the contrary, the numerical parameters set forth in the specification and attached claims are approximations that may vary depending upon the desired properties sought to be obtained by the present invention. At the very least, and not as an attempt to limit the application of the doctrine of equivalents to the scope of the claims, each numerical parameter should be construed in light of the number of significant digits and ordinary rounding approaches.

The above description discloses several methods and materials of the present invention. This invention is susceptible to modifications in the methods and materials, as well as alterations in the fabrication methods and equipment. Such modifications will become apparent to those skilled in the art from a consideration of this disclosure or practice of the invention disclosed herein. Consequently, it is not intended that this invention to be limited to the specific embodiments disclosed herein, but that it cover all modifications and alternatives coming within the true scope and spirit of the invention as embodied in the attached claims.

What is claimed is:

1. A method of passivating and contacting a surface of a germanium substrate, comprising:
   providing a germanium substrate having a first surface, wherein the first surface is configured to be used as a back surface of a photovoltaic device; thereafter
   forming a first hydrogenated amorphous silicon or amorphous silicon passivation layer on the first surface; thereafter
   forming a contact layer on the first hydrogenated amorphous silicon or amorphous silicon passivation layer, wherein the contact layer comprises a first metal layer, the first metal layer comprising aluminum; and thereafter
   forming an aluminum-diffused first hydrogenated amorphous silicon or amorphous silicon passivation layer by heating the substrate and the layers at a temperature of from about 180° C. to about 240° C. so that the first surface makes contact with the contact layer by diffusion of aluminum through the first hydrogenated amorphous silicon or amorphous silicon passivation layer to form a conductive path between the contact layer and the germanium substrate, whereby a photovoltaic device is obtained.

2. The method according to claim 1, wherein the first metal layer consists essentially of aluminum.

3. The method according to claim 1, wherein heating the substrate and the layers is performed locally, in a predetermined contact area.

4. The method according to claim 3, wherein heating is by a laser.

5. The method according to claim 1, wherein the contact layer is a continuous layer configured for use as a mirroring surface for the back surface.

6. The method according to claim 1, wherein a contact resistivity of the conductive path between the contact layer and the germanium substrate is less than about $10^{-4}$ $\Omega\text{cm}^2$.

7. The method according to claim 1, further comprising cleaning the first surface before forming the first hydrogenated amorphous silicon or amorphous silicon passivation layer, the cleaning comprising applying a $H_2$ containing plasma to the first surface.

8. The method of claim 1, further comprising cleaning the first surface before forming the passivation layer, the cleaning comprising applying a wet-chemical HF dip to the first surface.

9. The method according to claim 1, wherein forming the first hydrogenated amorphous silicon or amorphous silicon passivation layer is performed by plasma enhanced chemical vapor deposition.

10. The method according to claim 9, wherein the plasma enhanced chemical vapor deposition is performed at a temperature of from about 150° C. to about 300° C.

11. The method according to claim 1, wherein the first hydrogenated amorphous silicon or amorphous silicon passivation layer has a thickness of less than about 100 nm.

12. The method according to claim 1, wherein the first hydrogenated amorphous silicon or amorphous silicon passivation layer has a thickness of less than about 80 nm.

13. The method according to claim 1, wherein the first hydrogenated amorphous silicon or amorphous silicon passivation layer has a thickness of from about 20 nm to about 100 nm.

14. The method according to claim 1, wherein the photovoltaic device is selected from the group consisting of a solar cell, a thermophotovoltaic cell, and a photodetector.

15. The method according to claim 1, wherein the contact layer further comprises an additional metal layer, the additional metal layer comprising at least one metal selected from the group consisting of Cu, Ag, and Au.

16. The method according to claim 1, wherein the first metal layer is deposited atop the first hydrogenated amorphous silicon or amorphous silicon passivation layer, and wherein the additional metal layer is deposited atop the first metal layer.

17. The method according to claim 15, wherein the additional metal layer is deposited by evaporation.

18. The method according to claim 15, wherein the additional metal layer is deposited by electroplating.

19. The method according to claim 1, wherein forming a contact layer on the first hydrogenated amorphous silicon or amorphous silicon passivation layer further comprises patterning the contact layer to form a contact grid.

20. The method according to claim 1, further comprising:
   forming an emitter area in the germanium substrate; thereafter
   forming a second hydrogenated amorphous silicon or amorphous silicon passivation layer on a second surface of the germanium substrate, wherein the second surface is configured for use as front surface of a photovoltaic device;
   forming a front contact layer on the second hydrogenated amorphous silicon or amorphous silicon passivation layer, wherein the front contact layer comprises a second metal layer; and
   forming a metal-diffused second hydrogenated amorphous silicon or amorphous silicon passivation layer by heating the substrate and the layers at a temperature of from about 180° C. to about 240° C. so that the second surface makes contact with the front contact layer through the second hydrogenated amorphous silicon or amorphous silicon passivation layer.

21. The method according to claim 20, wherein the second metal layer comprises a metal selected from the group consisting of Pd, Cu, Ag, and Au.

22. The method according to claim 20, wherein only one heating step is performed for the front surface and the back surface.

23. The method according to claim 20, wherein the second surface makes contact with the front contact layer through the second hydrogenated amorphous silicon or amorphous silicon passivation layer before the first surface makes contact with the contact layer through the first hydrogenated amorphous silicon or amorphous silicon passivation layer.

24. The method according to claim 1, wherein heating is by a laser beam from a green (532 nm) YAG laser with a power of about 0.6 Watt, a diode current of 20 A, a propagation speed of the laser beam of 500 mm/min, a stage that was 0.250 mm out of focus, and a laser frequency of about 100 kHz.

25. The method according to claim 1, wherein heating is by a laser beam with a power of about 0.6 Watt, a diode current of 20 A, a propagation speed of the laser beam of 500 mm/min, a stage that was 0.250 mm out of focus, and a laser frequency of about 100 kHz.

26. A method of passivating and contacting a surface of a germanium substrate, comprising:
    providing a germanium substrate having a first surface and a second surface, wherein the first surface is configured to be used as a back surface of a photovoltaic device and wherein the second surface is configured to be used as a front surface of the photovoltaic device;
    forming a second hydrogenated amorphous silicon or amorphous silicon passivation layer on the second surface;
    forming a first hydrogenated amorphous silicon or amorphous silicon passivation layer on the first surface, wherein the first hydrogenated amorphous silicon or amorphous silicon passivation layer has a thickness of less than about 300 nm;
    forming a contact layer on the first passivation layer, wherein the contact layer comprises a first metal layer, the first metal layer comprising aluminum; and
    forming an aluminum-diffused first hydrogenated amorphous silicon or amorphous silicon passivation layer by heating the substrate and the layers at a temperature of from about 180° C. to about 240° C. so that the first surface makes contact with the contact layer by diffusion of aluminum through the first hydrogenated amorphous silicon or amorphous silicon passivation layer to form a conductive path between the contact layer and the germanium substrate, whereby a photovoltaic device is obtained.

27. The method according to claim 26, wherein the first hydrogenated amorphous silicon or amorphous silicon passivation layer has a thickness of less than about 100 nm.

28. The method according to claim 26, wherein the second hydrogenated amorphous silicon or amorphous silicon passivation layer has a thickness of less than about 40 nm.

29. The method according to claim 26, wherein the second hydrogenated amorphous silicon or amorphous silicon passivation layer has a thickness of from about 10 nm to about 40 nm.

30. The method according to claim 26, wherein the first hydrogenated amorphous silicon or amorphous silicon passivation layer has a thickness of from about 20 nm to about 100 nm.

31. The method according to claim 26, wherein the first hydrogenated amorphous silicon or amorphous silicon passivation layer has a thickness of from about 40 nm to about 90 nm.

32. The method according to claim 26, wherein the first hydrogenated amorphous silicon or amorphous silicon passivation layer has a thickness of from about 50 nm to about 80 nm.

33. The method according to claim 26, wherein heating is by a laser beam from a green (532 nm) YAG laser with a power of about 0.6 Watt, a diode current of 20 A, a propagation speed of the laser beam of 500 mm/min, a stage that was 0.250 mm out of focus, and a laser frequency of about 100 kHz.

34. The method according to claim 26, wherein heating is by a laser beam with a power of about 0.6 Watt, a diode current of 20 A, a propagation speed of the laser beam of 500 mm/min, a stage that was 0.250 mm out of focus, and a laser frequency of about 100 kHz.

* * * * *